United States Patent [19]

Yuhara et al.

[11] Patent Number: 4,500,807

[45] Date of Patent: Feb. 19, 1985

[54] SURFACE ACOUSTIC WAVE TRANSMISSION DEVICE FOR A LOW FREQUENCY SIGNAL BELOW 30 MHZ

[75] Inventors: Akitsuna Yuhara; Norio Hosaka; Yuji Fujita; Kiyoharu Kishimoto; Jun Yamada, all of Yokohama, Japan

[73] Assignee: Hitachi, Ltd., Tokyo, Japan

[21] Appl. No.: 455,280

[22] Filed: Jan. 3, 1983

[30] Foreign Application Priority Data

Jan. 11, 1982 [JP] Japan .................... 57-1826

[51] Int. Cl.³ .............................................. H03H 9/25
[52] U.S. Cl. ................ 310/313 B; 333/151; 333/194
[58] Field of Search .......... 310/313 R, 313 A, 313 B, 310/313 C, 313 D, 313 F, 326, 335; 333/151, 193, 154, 194

[56] References Cited

U.S. PATENT DOCUMENTS

| | | | |
|---|---|---|---|
| 3,515,910 | 6/1970 | Fritz et al. | 310/326 |
| 3,733,590 | 5/1973 | Kaufman | 310/326 |
| 4,028,646 | 6/1977 | Ikushima | 333/72 |
| 4,163,201 | 7/1979 | Takahashi et al. | 333/194 |
| 4,234,859 | 11/1980 | Ikushima | 333/151 |
| 4,364,017 | 12/1982 | Tokunaga et al. | 333/151 |

OTHER PUBLICATIONS

Matthews, H., "Surface Wave Filters", Wiley, NY, 1977, pp. 30-41.

Primary Examiner—J. D. Miller
Assistant Examiner—D. L. Rebsch
Attorney, Agent, or Firm—Antonelli, Terry & Wands

[57] ABSTRACT

Disclosed is a surface acoustic wave transmission device comprising a piezoelectric substrate provided thereon with an input and output transducers for transmitting and receiving the surface acoustic wave, a package for accommodating the piezoelectric substrate, and an adhesion layer for fixing the bottom of the piezoelectric substrate to the ground plane of the package. The adhesion layer is made to have a thickness of $\lambda_R/2.6$ or more wherein $\lambda_R$: is the wave length of the surface acoustic wave at the main lobe of the operating frequency, so that unnecessary waves caused by bulk wave components are absorbed.

31 Claims, 7 Drawing Figures

SURFACE ACOUSTIC WAVE TRANSMISSION DEVICE FOR A LOW FREQUENCY SIGNAL BELOW 30 MHZ

The present invention relates to a surface acoustic wave transmission device operating suitably at a frequency below 30 MHz.

The piezoelectric substrate used in the surface acoustic wave device for handling a frequency of around 50 MHz such as seen in the picture intermediate frequency (PIF) signal in the television receiver set has a thickness at least three times the wave length of the surface acoustic wave, and spurious components caused by the bulk wave response can be suppressed to an extent of practical satisfaction by proper selections for the crystal cut face and propagation direction, and proper forming on the bottom of the substrate. However, if a piezoelectric substrate for the PIF signal is applied directly to a signal below 30 MHz, spurious components caused by the bulk wave response cannot be suppressed sufficiently by the above-mentioned selections of direction and forming on account of its insufficient thickness.

The written report of the proceedings of the annual convention of the Japanese Electronic Communication Conference held in 1981, Vol. 1, page 68 (lecture number 68) discloses the following facts derived from a 17 MHz band-pass filter fabricated by using a substrate of monocrystalline LiNbO$_3$ with the 128° rotation, Y-plane, X-direction transmission:

(1) Due to longitudinal vibration with a frequency constant of 3.6 MHz-mm, many resonant peaks arose at frequencies, $f_n = 3.6 \, n/d$ (n=1, 3, 5, ... ).

(2) In order to avoid the resonant peaks in the main lobe, the substrate thickness d must be chosen in the range:

$$3.6n/f_L < d < 3.6(n+2)/f_u$$

($f_L$: Lowest frequency of main lobe, $f_u$: Highest frequency of main lobe)

(3) The substrate must have a thickness at least three times the wave length of the surface acoustic wave, otherwise the surface wave propagation would be adversely affected.

It is an object of the present invention to provide a surface acoustic wave transmission device capable of suppressing spurious components caused by bulk waves even at an operating frequency below 30 MHz.

The present invention is based on the attention to the absorption and attenuation of the acoustic wave by the adhesion layer between the piezoelectric substrate which serves for propagating the surface acoustic wave and the package ground plane that have not been considered in the past, with the adhesion layer made to have a thickness of $t \geq \lambda_r/2.6$ for the wave length $\lambda_R$ of a low-frequency surface acoustic wave so that bulk waves are absorbed and attenuated by the adhesion layer.

The present invention will be well understood from the following description of the preferred embodiments of the present invention with reference to the accompanying drawings in which.

Figure 1:
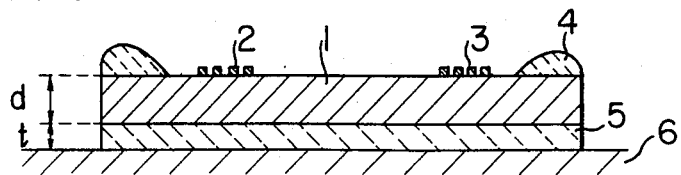
FIG. 1 is a side cross-sectional view showing one embodiment of the present invention.

Referring to FIG. 1, there is shown a surface acoustic wave transmission device comprising a piezoelectric substrate 1 having a thickness of d, on which there are disposed interdigital input electrode 2 and output electrode 3 formed of aluminum films, and further disposed acoustic wave absorbers 4 on both extensions of the propagation path at the edges of the substrate so as to prevent the surface acoustic wave from reflecting at the edges. The bottom of the substrate 1 is fixed on the ground plane 6 of the package through an adhesion layer 5 having a thickness of t. In this embodiment, the piezoelectric substrate 1 is made of monocrystalline LiNbO$_3$ of 128°-rotation Y-plane having a thickness of 0.5 mm, and the propagation direction is set to the X-axis direction. The input electrode 2 and output electrode 3 are of the unapodized or uniform type, having a pitch of 131.6 μm and an electrode width of 65.8 μm, and providing a center frequency of 14.74 MHz for the surface acoustic wave filter. The wave length $\lambda_R$ of the surface acoustic wave at this center frequency is 263.2 μm. Therefore, according to item (3) of the above-mentioned proceeding, the substrate must have a thickness d larger than 789.6 μm. According to the present invention, on the other hand, the thickness d of the piezoelectric substrate can be as small as 0.5 mm, and this is only about 1.9 times the wave length $\lambda_R$ of the surface acoustic wave. The thickness t of the adhesion layer, according to the present invention, is 0.1 mm or more, and in this embodiment, the adhesion layer is formed of electroconductive epoxy resin including silver particles having a thickness of 0.15 mm.

Figure 2:
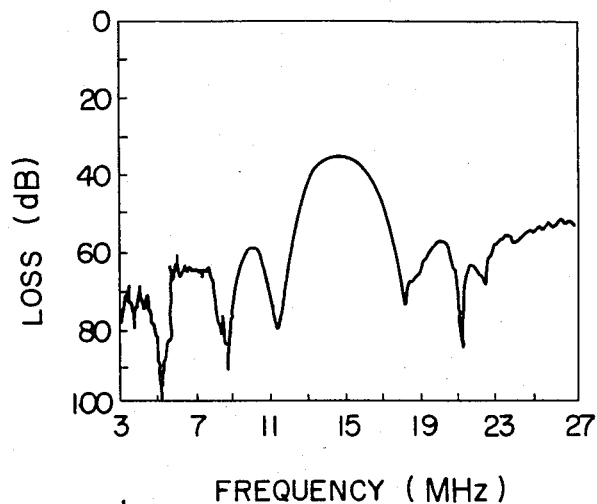
FIG. 2 is a graphical representation showing the frequency response of the surface acoustic transmission device shown in FIG. 1.
Figure 3:
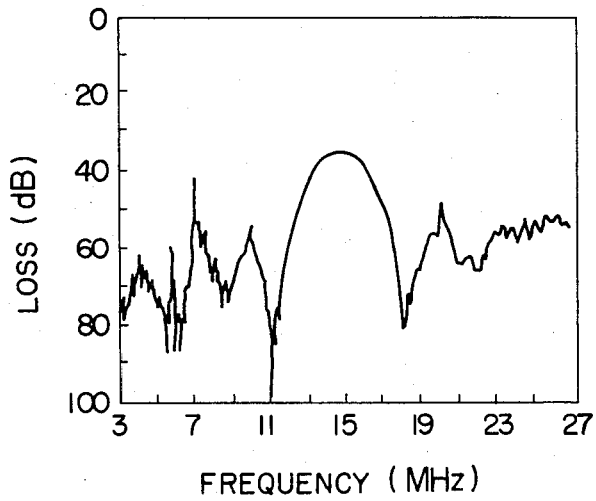
FIG. 3 is a graphical representation showing the frequency response of the conventional surface acoustic wave transmission device.

FIG. 2 is a plot of the loss vs. frequency characteristics measured for the surface acoustic wave filter embodied as described above, where the loss in dB is plotted on the ordinate against the frequency in MHz on the abscissa. For convenience of comparison, FIG. 3 shows the loss vs. frequency characteristics of the prior art surface acoustic wave filter with the adhesion layer of 0.047 mm in thickness and having other dimensions and formations identical to those of the inventive device. In FIG. 3, it can be observed many peaks of spurious waves, such as a peak at 7 MHz approx., a peak at 10 MHz approx. and a peak at 20 MHz approx., which might be caused by the longitudinal thickness vibration. Whereas, in FIG. 2, showing the loss vs. frequency characteristics of the inventive surface acoustic wave transmission device, the peaks at 10 MHz and 20 MHz seen in FIG. 3 are eliminated and the peak at 7 MHz is lowered by 20 dB. It was found that increasing the thickness of the adhesion layer to 0.256 mm produces a clear second side lobe on the lower frequency side of the uniform-type filter.

Accordingly, the present invention achieves satisfactory filter characteristics for the Rayleigh wave without being affected by spurious bulk waves even with the piezoelectric substrate having a thickness as small as two wave lengths of the surface acoustic wave.

Figure 4:
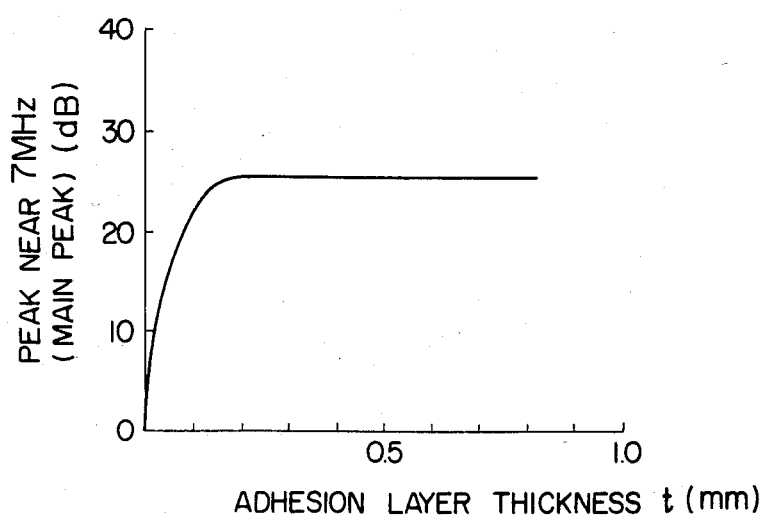
FIG. 4 is a plot showing the relationship between the thickness of adhesion layer and the attenuation.

The effect of the thickness of the adhesion layer of the inventive surface acoustic wave transmission device was examined in further detail for devices of the same structure as of the above embodiment and for the same kinds of adhesives. FIG. 4 is a plot as a result of the examination, showing the difference of levels (dB) between the main lobe and a peak spurious wave near 7.2 MHz, which might be caused by the longitudinal thickness vibration, plotted on the ordinate against the thickness of the adhesion layer on the abscissa. FIG. 4 indicates that the difference of the peak level of the spurious wave from the main lobe level increases sharply as the thickness of the adhesion layer increases, and reaches a constant value of 26 dB approximately at a thickness of around 0.15 mm. The constant value of 26 dB extends to approximately 0.8 mm (3.07 times the wave length of the acoustic wave). Consequently, if the adhesive layer has a thickness of slightly less than 0.1 mm, i.e., 0.38 (1/2.6) times the wave length of the surface acoustic wave, the difference of levels between the main lobe and the peak of spurious wave near 7.2 MHz will be more than 20 dB. This 20 dB reduction means a 1-digit-order reduction in the magnitude of voltage or a 2-digit-order reduction in the magnitude of power, and it is small enough for practical applications.

The adhesion layer uses a die bonding material made of epoxy resin including silver particles and used widely in the integrated circuit assembling process. The silver particles may be replaced by fine glass beads coated with silver or other metallic particles coated with silver, and the adhesion layer may be formed of resin including copper particles, Ni particles, Al particles, carbon particles, or carbon fiber. For the electroconductive resin, organic conductor of intermolecular compound may be used.

Figure 7:
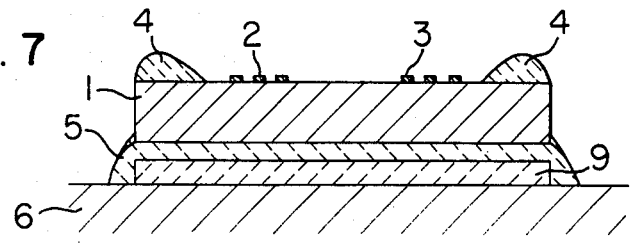

Furthermore, the adhesion layer may be formed in 2-layer structure by coating the package ground plane with a layer of non-electroconductive resin 9 such as epoxy resin to a thickness of 0.1 mm and coating the bottom of the piezoelectric substrate with conductive resin 5 containing silver particles to a thickness of 0.01 mm, as shown in FIG. 7. In this case, when the conductive resin partly juts out of the epoxy resin layer to come into contact with the package ground plane (reference potential), direct propagation can be reduced.

Moreover, the bottom of the piezoelectric substrate may be metalized (e.g., by depositing Al or by depositing two layers of Au and Cr), so that low-temperature solder is used for the adhesion layer.

Figure 5:
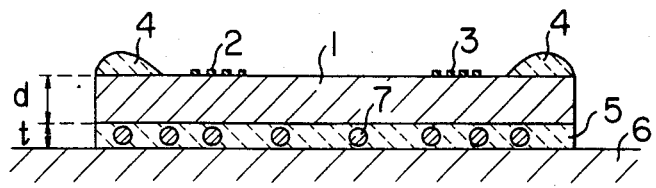
FIGS. 5, 6 and 7 are side cross-sectional views showing other embodiments of the present invention.

In addition, although detailed description is omitted here, conductive resin made of epoxy resin including silver particles and other particles 7, e.g., quartz particles, having a diameter as large as the thickness of the layer as shown in FIG. 5 provides a satisfactory result. In this case, the piezoelectric substrate provided with the electrodes is fixed using silver-epoxy resin including particles 7 having a dimension similar to the thickness of the layer. On this account, this embodiment provides easy adjustment of the thickness of the adhesion layer, allowing direct introduction of an automatic die bonder, and high productivity can be achieved as a by-product. As a modified version of this embodiment, the adhesion layer with mixed glass or carbon fibers instead of particles, and a film-formed conductive adhesion layer made of, for example, a glass fiber cloth soaked with silver-epoxy resin may be used with a satisfactory result.

Figure 6:
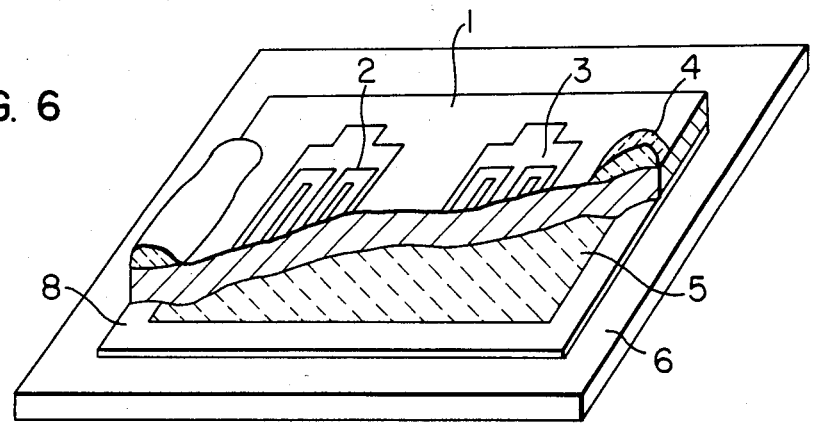

In addition, as shown in the partly exploded perspective view of FIG. 6, a spacer 8 may be disposed out of the back side area corresponding to the transmitting and receiving electrodes and the propagation path between them, so that a necessary thickness of the adhesion layer is obtained for fixing the piezoelectric substrate to the package ground plane. The spacer may be made of fiber, film or wire, and an adhesive film with its central portion being punched off in a rectangular shape is particularly effective. This arrangement allows a large freedom in determining the plan, and the thickness of the adhesion layer can be set easily.

According to the present invention, as described above, the surface acoustic wave transmission device having the main lobe below 30 MHz can easily be rid of the spurious bulk wave response to an extent of practical tolerance. As a consequence, the thickness of the substrate, which must have been at least three times the wave length $\lambda_R$ of the surface acoustic wave in prior art devices, can be reduced to about two times the wave length $\lambda_R$ in building a surface acoustic wave transmission device for practical use.

We claim:

1. A surface acoustic wave transmission device comprising:
   a piezoelectric substrate having two opposing main surfaces and provided on one of the surfaces an input transducer for transforming an electrical signal into a surface acoustic wave signal and an output transducer for transforming said surface acoustic wave signal into an electrical signal, said substrate propagating said surface acoustic wave signal from said input transducer to said output transducer;
   a base body for mounting said piezoelectric substrate with the other surface thereof being adjacent to said body; and
   an adhesion layer for fixing said other surface of said substrate to said base body, said adhesion layer having a thickness at least 1/2.6 times the wave length of said surface acoustic wave signal.

2. A surface acoustic wave transmission device according to claim 1, wherein said adhesion layer is made of an electroconductive resin.

3. A surface acoustic wave transmission device according to claim 1, wherein said adhesion layer is made of an electroconductive resin including electroconductive particles distributed in resin.

4. A surface acoustic wave transmission device according to claim 1, wherein said adhesion layer is formed of a non-electroconductive resin layer fixed to said base body and an electroconductive resin layer formed between said non-electroconductive resin layer and the bottom of said piezoelectric substrate.

5. A surface acoustic wave transmission device according to claim 1, wherein said adhesion layer is made of low-temperature solder.

6. A surface acoustic wave transmission device according to claim 1, wherein said adhesion layer is made of electroconductive resin including by mixing particles having a diameter as large as the thickness of said adhesion layer.

7. A surface acoustic wave transmission device according to claim 1, further comprising spacer means disposed between said piezoelectric substrate and said base body and formed with an opening which extends wider than a portion of the other surface of said substrate opposing said input and output transducers and a propagation path formed between said transducers, said adhesion layer being disposed inside said opening.

8. A surface acoustic wave transmission device according to claim 1, wherein the thickness of said substrate in not larger than three times the wave length of said surface acoustic wave signal.

9. A surface acoustic wave transmission device according to claim 8, wherein said adhesion layer is made of electroconductive resin.

10. A surface acoustic wave transmission device according to claim 1, wherein the surface acoustic wave transmission device is operative at a frequency substantially below 30 MHz.

11. A surface acoustic wave transmission device according to claim 10, wherein said adhesion layer is made of electroconductive resin.

12. A surface acoustic wave transmission device according to claim 1 wherein said adhesive layer is approximately 0.1 mm in thickness.

13. A surface acoustic wave transmission device according to claim 1 wherein said piezoelectric substrate is approximately 0.5 mm in thickness.

14. A surface acoustic wave transmission device having a main lobe below 30 MHz comprising:
 a piezoelectric substrate having two opposing main surfaces and provided on one of the surfaces an input transducer for transforming an electrical signal into a surface acoustic wave signal and an output transducer for transforming said surface acoustic wave signal into an electrical signal, said substrate propagating said surface acoustic wave signal from said input transducer to said output transducer and having a thickness ranging from 1.9 to 3.0 times the wave length of said surface acoustice wave signal;
 a base body for mounting said piezoelectric substrate with the other surface thereof being adjacent to said body; and
 an adhesion layer for fixing said other surface of said substrate to said base body, said adhesion layer having a thickness at least 1/2.6 times and not greater than 3.07 times said wave length of said surface acoustic wave signal.

15. A surface acoustic wave transmission device according to claim 14, wherein said adhesion layer is made of an electroconductive resin.

16. A surface acoustic wave transmission device according to claim 14, wherein said adhesion layer is made of an electroconductive resin including electroconductive particles distributed in resin.

17. A surface acoustic wave transmission device according to claim 14, wherein said adhesion layer is formed of a non-electroconductive resin layer fixed to said base body and an electroconductive resin layer formed between said non-electroconductive resin layer and the bottom of said piezoelectric substrate.

18. A surface acoustic wave transmission device according to claim 14, wherein said adhesion layer is made of low-temperature solder.

19. A surface acoustic wave transmission device according to claim 14, wherein said adhesion layer is made of electroconductive resin including by mixing particles having a diameter as large as the thickness of said adhesion layer.

20. A surface acoustic wave transmission device according to claim 14, further comprising spacer means disposed between said piezoelectric substrate and said base body and formed with an opening which extends wider than a portion of the other surface of said substrate opposing said input and output transducers and a propagation path formed between said transducers, said adhesion layer being disposed inside said opening.

21. A surface acoustic wave transmission device according to claim 14 wherein said adhesion layer is approximately 0.1 mm in thickness.

22. A surface acoustic wave transmission device according to claim 14 wherein said piezoelectric substrate is approximately 0.5 mm in thickness.

23. A surface acoustic wave transmission device comprising:
 a piezoelectric substrate having two opposing main surfaces and provided on one of the surfaces an input transducer for transforming an electrical signal into a surface acoustic wave signal and an output transducer for transforming said surface acoustic wave signal into an electrical signal, said substrate propagating said surface acoustic wave signal from said input transducer to said output transducer;
 a base body for mounting said piezoelectric substrate with the other surface thereof being adjacent to said body; and
 an adhesion layer for fixing said other surface of said substrate to said base body, said adhesion layer having a thickness at least 1/2.6 and not greater than 3.07 times the wave length of said surface acoustic wave signal.

24. A surface acoustic wave transmission device according to claim 23, wherein said adhesion layer is made of an electroconductive resin.

25. A surface acoustic wave transmission device according to claim 23, wherein said adhesion layer is made of an electroconductive resin including electroconductive particles distributed in resin.

26. A surface acoustice wave transmission device according to claim 23, wherein said adhesion layer is formed of a non-electroconductive resin layer fixed to said base body and an electroconductive resin layer formed between said non-electroconductive resin layer and the bottom of said piezoelectric substrate.

27. A surface acoustic wave transmission device according to claim 23, wherein said adhesion layer is made of low-temperature solder.

28. A surface acoustic wave transmission device according to claim 23, wherein said adhesion layer is made of electroconductive resin including by mixing particles having a diameter as large as the thickness of said adhesion layer.

29. A surface acoustic wave transmission device according to claim 23, further comprising spacer means disposed between said piezoelectric substrate and said base body and formed with an opening which extends wider than a portion of the other surface of said substrate opposing said input and output transducers and a propagation path formed between said transducers, said adhesion layer being disposed inside said opening.

30. A surface acoustic wave transmission device according to claim 23, wherein said adhesion layer is approximately 0.1 mm in thickness.

31. A surface acoustic wave transmission device according to claim 23, wherein said piezoelectric substrate is approximately 0.5 mm in thickness.

* * * * *